(12) United States Patent
Kim

(10) Patent No.: US 7,556,990 B2
(45) Date of Patent: Jul. 7, 2009

(54) CMOS IMAGE SENSOR HAVING IMPROVED SIGNAL EFFICIENCY AND METHOD FOR MANUFACTURING THE SAME

(75) Inventor: Bum Sik Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 4 days.

(21) Appl. No.: 11/319,969

(22) Filed: Dec. 29, 2005

(65) Prior Publication Data

US 2006/0145205 A1 Jul. 6, 2006

(30) Foreign Application Priority Data

Dec. 30, 2004 (KR) .................. 10-2004-0116418

(51) Int. Cl.
*H01L 31/113* (2006.01)
(52) U.S. Cl. .................. 438/149; 257/374; 257/510; 257/213; 257/212; 257/184; 257/187; 257/259; 257/E21.63; 257/E21.644; 438/48; 438/51; 438/60
(58) Field of Classification Search .................. 257/374, 257/510, 213, 212, 184, 187, 259; 438/149, 438/48, 51, 60
See application file for complete search history.

(56) References Cited

U.S. PATENT DOCUMENTS

| | | | | |
|---|---|---|---|---|
| 5,858,847 A | * | 1/1999 | Zhou et al. | 438/305 |
| 6,040,592 A | * | 3/2000 | McDaniel et al. | 257/292 |
| 6,156,596 A | * | 12/2000 | Jwo | 438/220 |
| 6,521,926 B1 | * | 2/2003 | Sasaki | 257/292 |
| 6,583,484 B2 | * | 6/2003 | Pan et al. | 257/461 |
| 6,642,087 B2 | * | 11/2003 | Nozaki et al. | 438/149 |
| 2001/0023095 A1 | * | 9/2001 | Kopley et al. | 438/200 |
| 2003/0127666 A1 | | 7/2003 | Lee | |
| 2004/0033667 A1 | | 2/2004 | Lee | |
| 2005/0088556 A1 | * | 4/2005 | Han | 348/308 |
| 2005/0176167 A1 | * | 8/2005 | Lee | 438/60 |

FOREIGN PATENT DOCUMENTS

KR   10-2003-0056099   7/2003

* cited by examiner

*Primary Examiner*—Wai-Sing Louie
*Assistant Examiner*—Marc Armand
(74) *Attorney, Agent, or Firm*—McKenna Long & Aldridge LLP

(57) ABSTRACT

A CMOS image sensor and a method for manufacturing the same improves signal efficiency by reducing a dark signal, and includes a substrate having a first conductive type comprising an image area and a circuit area, a STI isolation layer in the substrate for electrical isolation within the circuit area, and a field oxide in the substrate for electrical isolation within the image area.

4 Claims, 4 Drawing Sheets

CMOS IMAGE SENSOR HAVING IMPROVED SIGNAL EFFICIENCY AND METHOD FOR MANUFACTURING THE SAME

CROSS-REFERENCE TO RELATED APPLICATION

This application claims the benefit of Korean Patent Application No. P2004-116418, filed on Dec. 30, 2004, which is hereby incorporated by reference for all purposes as if fully set forth herein.

BACKGROUND OF THE INVENTION

1. Field of the Invention

The present invention relates to a CMOS image sensor and a method for fabricating the same.

2. Discussion of the Related Art

FIG. 1 illustrates a cross sectional view of a CMOS image sensor according to the related art. FIG. 2 illustrates a cross sectional view of an active region in a CMOS image sensor according to the related art.

As shown in FIG. 1 and FIG. 2, a p-type well 2 is formed in a p-type substrate 1. Also, shallow trench isolation STI regions 3 are formed in a surface of the p-type well 2 for electric isolation of pixels.

Then, an N-type photodiode 5 is formed inside the P-type well 2 in each of cell regions 4. Also, impurity regions 6 are formed in the surface of the P-type well 2 adjacent to the N-type photodiode 5, wherein the impurity regions 6 serve as source and drain regions.

Subsequently, a poly-silicon gate electrode 7 is formed on the surface of the P-type well 2 in correspondence with the impurity regions 6. In the drawings, a voltage source Vc applies a voltage to the impurity regions 6, and a gate insulating layer 8 is provided.

As designs become smaller when forming the poly-silicon gate electrode for a CMOS transistor according to the related art, shallow trench isolation (STI) is often used to isolate the pixels from one another.

STI, trenches are formed in the surface of the P-type well 2, and then oxide layers are grown or deposited into the trenches. After that, an etch-back process is performed to the oxide layers, whereby isolation layers are formed in the trenches for isolation of the pixels.

However, when etching the surface of the flat silicon substrate 1, crumpled portions may be generated. In this case, mechanical and electrical stresses may be generated in a tilted or crumpled surface between the oxide layer inside the trench and the silicon substrate 1, thereby causing an increase in defect density. Accordingly, a leakage current occurs in the CMOS image sensor, and a dark defect occurs in images.

SUMMARY OF THE INVENTION

Accordingly, the present invention is directed to a CMOS image sensor and a method for manufacturing the same that substantially obviates one or more problems due to limitations and disadvantages of the related art.

The present invention provides a CMOS image sensor having an improved signal efficiency in low light circumstances by reducing a dark signal.

Additional advantages and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a CMOS image sensor including a substrate having a first conductive type comprising an image area and a circuit area, a STI isolation layer in the substrate for electrical isolation within the circuit area, and a field oxide in the substrate for electrical isolation within the image area.

A gate electrode comprising a gate oxide and a polysilicon gate can be formed on the circuit area of the substrate. Both side portions of the gate oxide can be formed on the field oxide.

In another aspect of the present invention, there is provided a method for manufacturing a CMOS image sensor including the steps of forming a STI isolation layer in a substrate of a first conductive type, wherein the substrate comprises an image area and a circuit area and the STI isolation layer is for electrical isolation within the circuit area. The method can further include forming a field oxide in the substrate for electrical isolation within the image area.

The field oxide formation can comprise the steps of forming a pad oxide on the substrate, forming a nitride on the pad oxide, selectively etching the nitride and pad oxide sequentially so that a portion of the substrate where the field oxide is to be formed is exposed, and forming a thermal oxide on the exposed portion of the substrate by performing thermal oxidation process on the entire substrate.

The method can further comprise a step of forming a gate electrode on the circuit area of the substrate. The gate electrode formation can comprise the steps of forming a CVD oxide layer on the entire surface of the substrate, including the thermal oxide by performing CVD process; forming a polysilicon layer on the CVD oxide layer; and selectively etching the polysilicon layer and CVD oxide layer sequentially in such a way that at least a portion of remained CVD oxide layer overlaps with the thermal oxide.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate exemplary embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
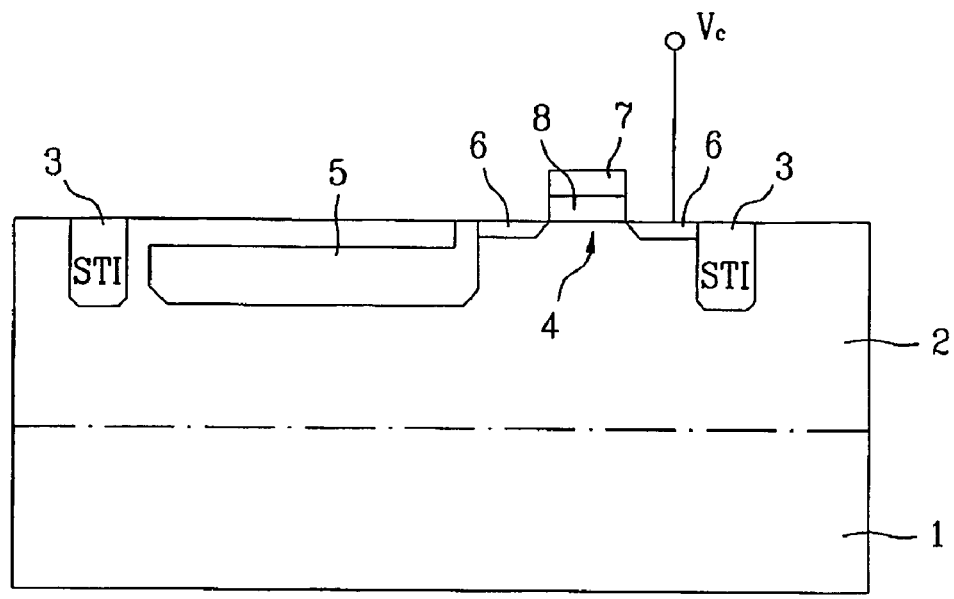
FIG. 1 is a cross sectional view of a CMOS image sensor according to the related art.
Figure 2:
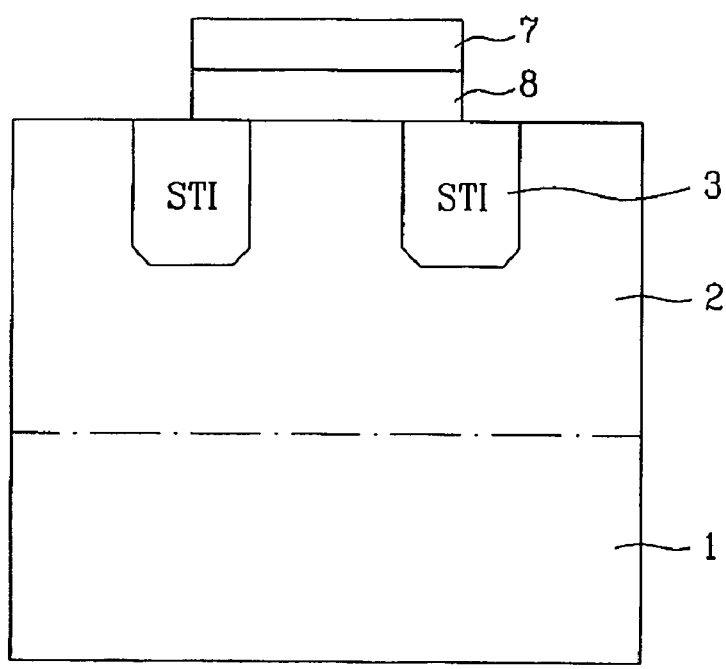
FIG. 2 is a cross sectional view illustrating an active region in a CMOS image sensor according to the related art.
Figure 3:
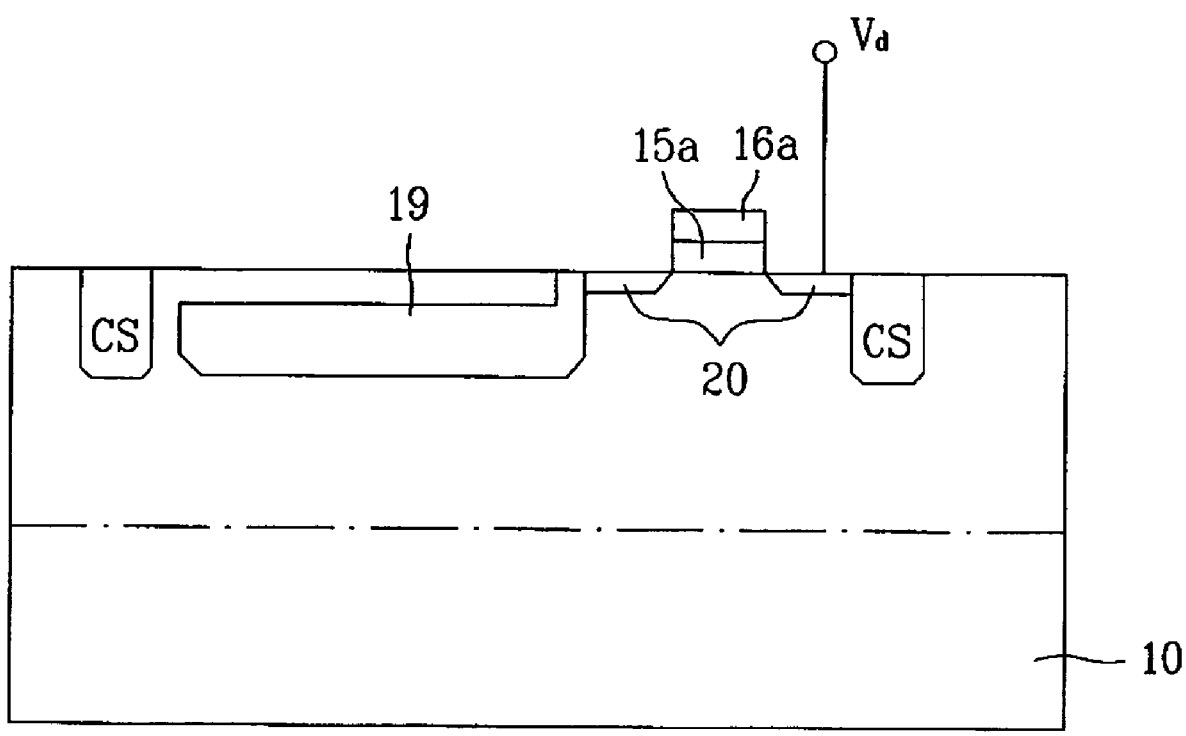
FIG. 3 is a cross sectional view of a CMOS image sensor according to an exemplary embodiment of the present invention.

FIG. 3 illustrates a cross sectional view of a CMOS image sensor according to the present invention.

As shown in FIG. 3, a P-type well (not shown) is formed in a P-type substrate 10. Also, channel stop regions CS 12 are formed in a surface of the P-type well 11, wherein the channel stop regions CS function as isolation regions for electrically isolating pixels from one another. The channel stop regions CS 12 are formed by forming field oxide layers (not shown) in field regions of the substrate 10 through a LOCOS (Local Oxidation of Silicon) process and then implanting channel stop ions to the portions of the substrate 10 below the field oxide layers. A N-type photodiode 19 and a source/drain region 20 are respectively formed in the P-type well of each of the pixel areas. A polysilicon gate 16a is formed on the source/drain region 20. A voltage source Vd for applying a voltage to the source/drain region 20 and a gate oxide 15a are provided.

FIG. 4A to 4F are cross sectional views illustrating processes for making an active region in a CMOS image sensor according to the present invention.

Figure 4A:
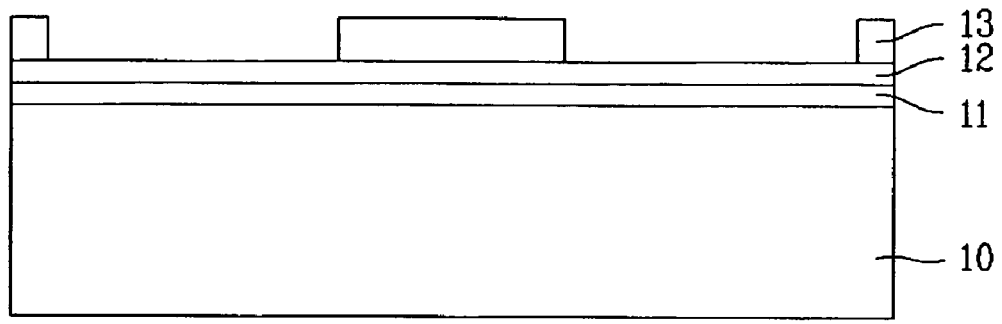
FIG. 4A to 4F are cross sectional views of a CMOS image sensor fabricated using a method according to an exemplary embodiment of the present invention.

As shown is FIG. 4A, a P-type well is formed in a P-type substrate 10 by implanting P-type ions thereto. A pad oxide layer 11 and nitride layer 12 are sequentially formed on the P-type well. A photoresist pattern 13 is then formed on the nitride layer 12 to expose a portion of the nitride layer 12 corresponding to field regions.

Figure 4B:
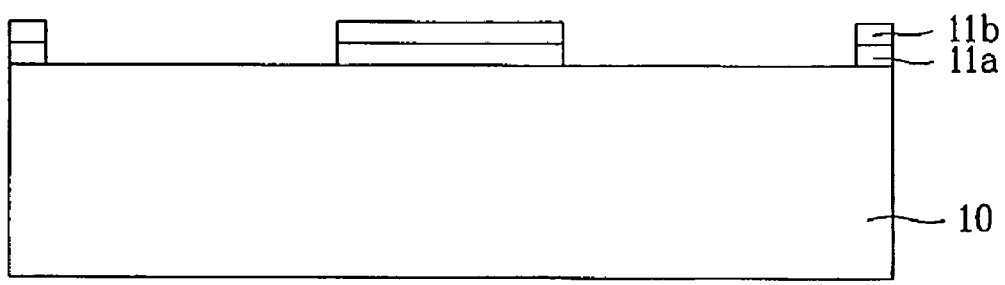

Referring to FIG. 4B, a pad oxide pattern 11a and a nitride pattern 12a are formed by selectively etching the pad oxide layer 11 and nitride layer 12 using the photoresist pattern 13 as a mask and then stripping the photoresist pattern 13.

Figure 4C:
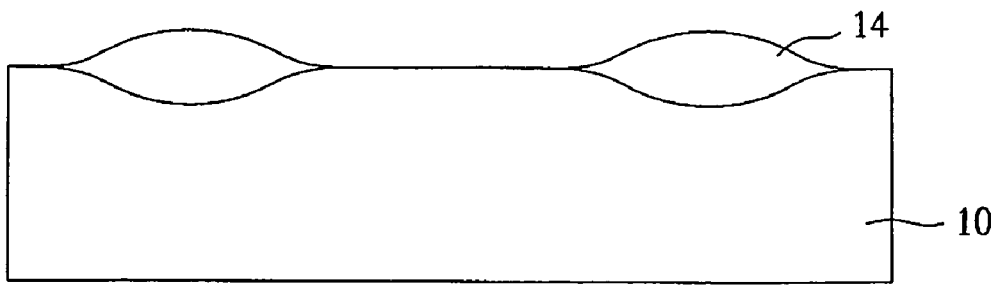

Referring to FIG. 4C, a field oxide 14 is formed on the exposed portion of the substrate 10 by performing a thermal oxidation process. Subsequently, the nitride pattern 12a and pad oxide pattern 11a are removed.

Figure 4D:
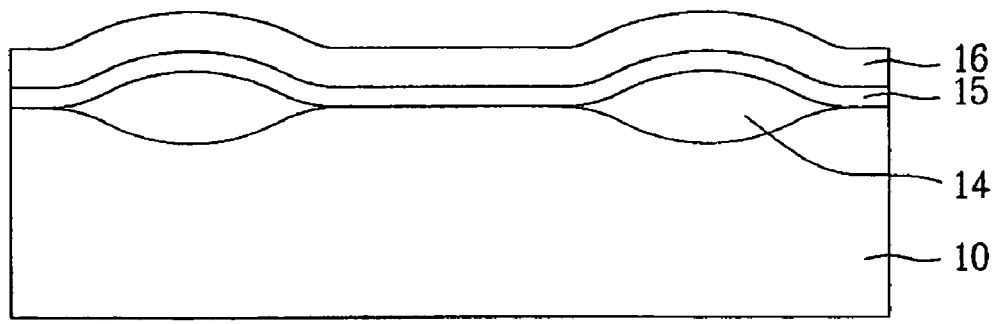

Referring to FIG. 4D, a CVD process is performed on the entire surface of the substrate 10, including the field oxide 14, to form a gate oxide layer 15 thereon. Then, a polysilicon layer 16 is deposited on the gate oxide layer 15.

Figure 4E:
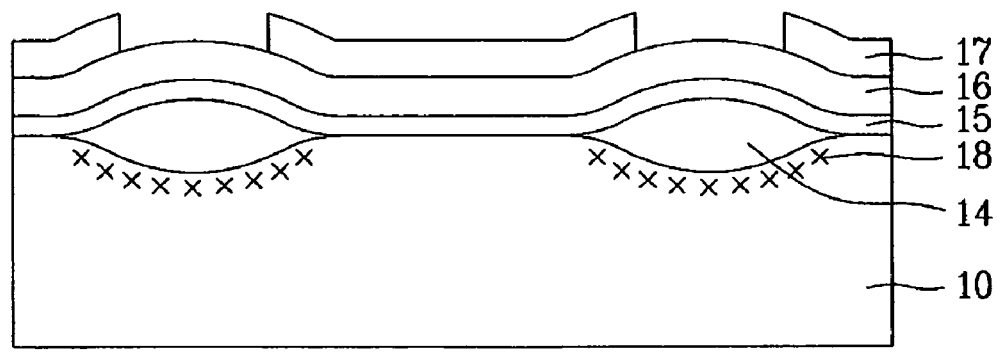

As shown in FIG. 4E, after a photoresist pattern 17 is formed on the polysilicon layer 16 in such a way that a portion of the polysilicon layer 16 corresponding to the field oxide 14 is exposed, channel stop ions of high density are implanted using the photoresist pattern 17 as a mask. The channel stop ions are the same conductive type as the substrate 10, that is, P-type. Consequently, the implanted channel stop ions constitute a P-type ion area 18 below the field oxide 14, which constitute a channel stop region together with the field oxide 14.

Figure 4F:
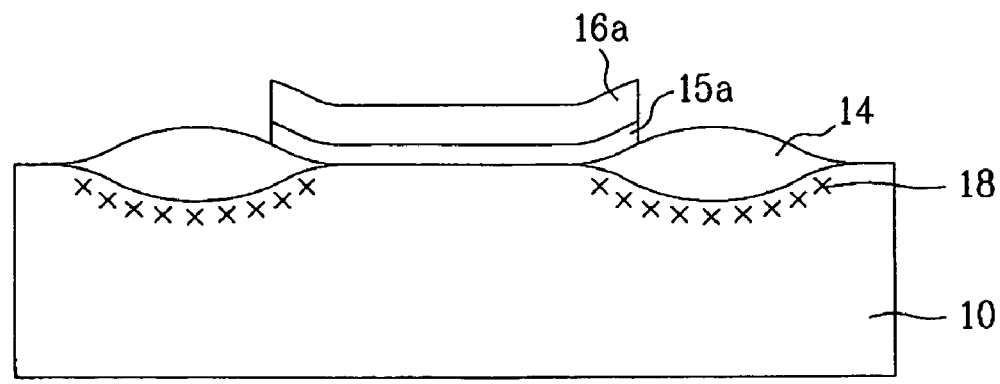

Referring to FIG. 4F, the polysilicon layer 16 and gate oxide layer 15 are selectively etched using the photoresist pattern 17 as a mask. As a result, a gate oxide 15a and a polysilicon gate 16a are formed on the circuit area of the substrate 10. According to an exemplary embodiment of the present invention, the gate oxide 15a is formed in such a way that both sides of the gate oxide 15a overlap with the field oxide 14.

Subsequently, N-type photodiode 19 (see FIG. 3) and source/drain region 20 (see FIG. 3) are sequentially formed using a conventional process.

In forming the isolation regions for the CMOS image sensor according to the present invention, the oxide layers are formed in the pixels by gate oxide and CVD oxide deposition instead of a shallow trench isolation STI process according to the related art.

Accordingly, a silicon substrate etching process required for performing a STI process can be avoided, at least in the inner area of the substrate corresponding to each pixel. Thus, it is possible to minimize a stress between the oxide layer and the silicon substrate.

Using the gate oxide and CVD oxide, a threshold voltage is increased in the field region contrary to an active region for forming a transistor to result in no effect on the operation of a circuit. That is, while the related art STI process is still used in the circuit area, the STI process is replaced with LOCOS process in the imaging area.

In the CMOS image sensor according to the present invention, it is possible to decrease a parasitic capacitance between the poly-silicon gate electrode and the substrate, thereby decreasing noise caused by coupling.

Also, it is possible to minimize the surface deformation of the silicon substrate when performing the process for isolation of the pixels, thereby decreasing a dark signal and a dark defect.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a CMOS image sensor comprising the steps of:
   forming a pad oxide on a substrate having a first conductive type and including an image area and a circuit area;
   forming a nitride on the pad oxide;
   selectively etching the nitride and pad oxide sequentially so that a portion of the substrate where a field oxide is to be formed is exposed;
   forming a thermal oxide as a LOCOS field oxide in the substrate for electrical isolation within the image area, on the exposed portion of the substrate by performing a thermal oxidation process on the entire substrate;
   implanting channel stop ions below the formed thermal oxide; and
   forming a gate electrode on the circuit area of the substrate, wherein the gate electrode formation comprises the steps of:
   forming a CVD oxide layer on the entire surface of the substrate, including the thermal oxide, by performing CVD process;
   forming a polysilicon layer on the CVD oxide layer; and
   selectively etching the polysilicon layer and CVD oxide layer sequentially in such a way that both sides of the remaining CVD oxide layer overlap with the thermal oxide.

2. The method of claim 1, further comprising a step of forming a well of the first conductive type in the substrate.

3. The method of claim 1, further comprising a step of forming a photodiode in the image area of the substrate by implanting second conductive type ions thereto.

4. The method of claim 3, wherein the first conductive type is P-type and the second conductive type is N-type.

* * * * *